(12) United States Patent
Aggarwal (10) Patent No.: US 7,307,294 B2
(45) Date of Patent: Dec. 11, 2007

(54) CIRCUIT LAYOUT STRUCTURE (75) Inventor: Sachin Aggarwal, Noida (IN)

(73) Assignee: Sanyo Electric Co., Ltd., Osaka (JP)

( * ) Notice: Subject to any disclaimer, the term of this patent is extended or adjusted under 35 U.S.C. 154(b) by 193 days.

(21) Appl. No.: 10/537,124

(22) PCT Filed: Dec. 1, 2003

(86) PCT No.: PCT/JP03/15328

§ 371 (c)(1),
(2), (4) Date: Jun. 2, 2005

(87) PCT Pub. No.: WO2004/051741

PCT Pub. Date: Jun. 17, 2004

(65) Prior Publication Data

US 2006/0026547 A1 Feb. 2, 2006

(30) Foreign Application Priority Data

Dec. 3, 2002 (JP) ............................ 2002-351187

(51) Int. Cl.
H01L 27/10 (2006.01)
(52) U.S. Cl. ................ 257/202; 257/206; 257/E27.013
(58) Field of Classification Search ................ 257/202, 257/206, 213, E27.013; 365/51, 63, 230.03
See application file for complete search history.

(56) References Cited

U.S. PATENT DOCUMENTS 4,121,197 A * 10/1978 Ogawa et al. ............ 178/18.01
5,644,517 A * 7/1997 Ho ............................ 708/401
5,959,928 A * 9/1999 Oh et al. ............... 365/230.03
6,404,695 B1 * 6/2002 Fujino et al. .......... 365/230.03
6,552,402 B1 4/2003 Ozasa et al.

FOREIGN PATENT DOCUMENTS

JP 08-274259 10/1996
JP 2001-168197 6/2001

OTHER PUBLICATIONS

Mao-Feng et al. (2001) "Current Mirror Layout Strategies for Enhancing Matching Performance," Analog Integrated Circuits and Signal Processing 28, pp. 9-26.

Marcel J. M. Pelgrom et al. (1989) "Matching Properties of MOS Transistors," IEEE Journal of Solid-State Circuits 24(5), pp. 1433-1439.

* cited by examiner

Primary Examiner—Brook Kebede
(74) Attorney, Agent, or Firm—Morrison & Foerster LLP (57) ABSTRACT Main-transistors M1 and M2 are divided into sub-transistors that are arrayed in a matrix with four rows and four columns to form four cells so that each of the cells is formed of four of the sub-transistors that have a common center. This can realize a layout configuration that is as good in matching of the main-transistors M1 and M2 as a four-segment layout scheme and takes small pattern area.

7 Claims, 10 Drawing Sheets

CIRCUIT LAYOUT STRUCTURE

BACKGROUND OF THE INVENTION

1. Field of the Invention

This invention relates to a circuit layout configuration, for example, a circuit layout configuration to improve matching characteristics of a transistor pair in a circuit having the transistor pair such as a current mirror circuit and a differential amplifier.

2. Description of the Related Art

Figure 7:
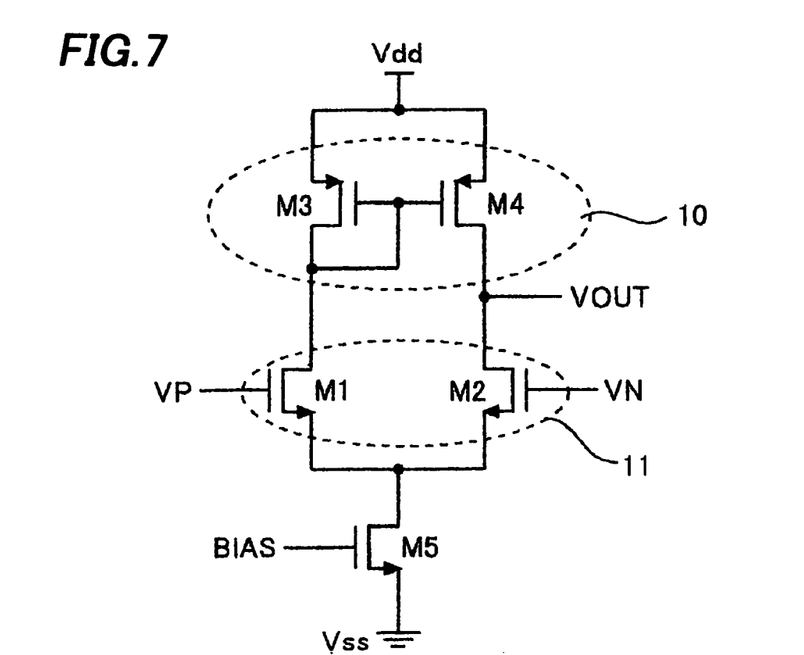
FIG. 7 is a circuit diagram showing a differential gain stage.

Close matching between the transistors is important for the configuration of the current mirror circuit and of the differential amplifier. In particular, the close matching helps in obtaining a low offset operational amplifier. FIG. 7 is a circuit diagram showing a differential gain stage. A pair of MOS transistors M3 and M4 forms a current mirror circuit 10 and another pair of MOS transistors M1 and M2 forms a differential input pair 11. Each of the pairs of MOS transistors requires close matching respectively.

The most basic layout scheme to implement the current mirror circuit 10 is a lateral layout scheme. A better option is a common-centroid layout scheme. These layout schemes and a scheme called four-segment layout scheme are described in the following document.

Mao-Feng Lan, Anilkumar Tammineedi and Randall Geiger, "Current Mirror Layout Strategies for Enhancing Matching Performance", Analog Integrated Circuits and Signal Processing, vol. 28, PP. 9-26, July 2001.

Figure 8:
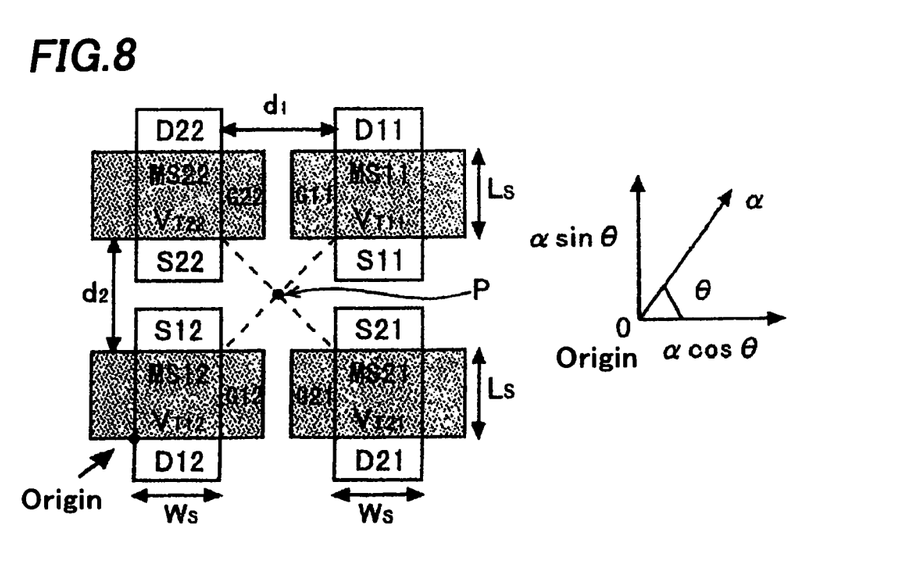
FIG. 8 is a plan view showing a common-centroid layout scheme.
Figure 9:
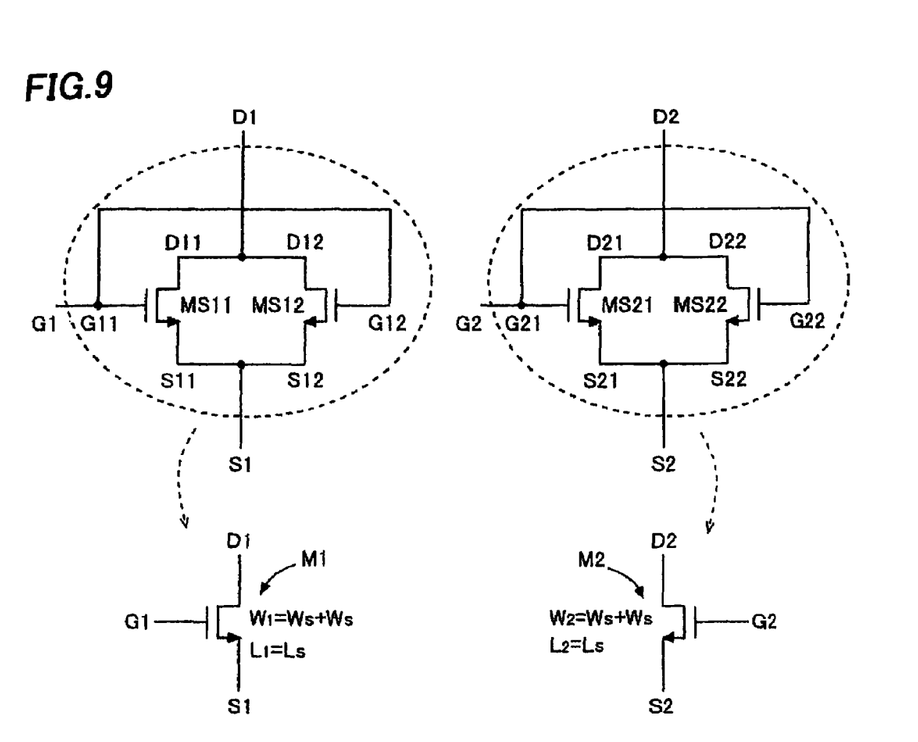
FIG. 9 is an equivalent circuit diagram of the common-centroid layout scheme.

These conventional layout schemes will be explained hereinafter. FIG. 8 shows the common-centroid layout scheme. FIG. 9 shows an equivalent circuit of FIG. 8. M1 and M2 are MOS field effect transistors that are to be matched. The transistor M1 is divided into two sub-transistors MS11 and MS12. Similarly, the transistor M2 is divided into two sub-transistors MS21 and MS22.

Since these sub-transistors have a common center P as shown in FIG. 8, it is called the common-centroid layout scheme. And gates, drains and sources of the sub-transistors MS11 and MS12 are connected in common to form the transistor M1, as shown in FIG. 9. Similarly, gates, drains and sources of the sub-transistors MS21 and MS22 are connected in common to form the transistor M2.

And now, when the following document on transistor-matching and process-dependent layout structures is referred, transistors in various layouts are modeled.

M. J. M. Pelgrom, A. C. J. Duinmaijer and A. P. G. Welbers, "Matching properties of MOS transistors" IEEE JSSC, Vol. SC-24, PP. 1433-1439, 1989.

According to the document, an equivalent threshold voltage for such a device is given by the following equation.

$$V_{Teq} = \frac{\int_{active}\int_{area} V_T(x,y)\,dx\,dy}{ActiveArea}$$

Here, the Active Area denotes an active area of the sub-transistor, that is, a channel region through which a current flows. $V_T(x, y)$ is a local threshold voltage that depends on x and y coordinates. A surface integral of $V_T(x, y)$ over the active region is calculated to find its average.

And the threshold voltage varies from place to place on a surface of a wafer because of processing. Modeling of the variation in the threshold voltage is made possible by introducing a gradient amplitude a and a gradient direction $\theta$ from an origin O shown in FIG. 8.

Therefore, each of corresponding threshold voltages $V_{T11}$, $V_{T12}$, $V_{T21}$ and $V_{T22}$ can be obtained by applying such a threshold voltage model to each of the above mentioned sub-transistors MS11, MS12, MS21 and MS22, respectively.

First, the threshold voltage $V_{T11}$ of the sub-transistor MS11 is given by the following equation.

MS11:

$$V_{T11} = \frac{\int_{(L_S+d_2)}^{(2L_S+d_2)}\int_{(W_S+d_1)}^{(2W_S+d_1)}\left[\begin{array}{c}V_T + (L_S\alpha\sin\theta) + \\ (W_S\alpha\cos\theta)\end{array}\right] \times [dW] \times [dL]}{W_s \times L_s}$$

$$V_{T11} = \frac{\int_{(L_S+d_2)}^{(2L_S+d_2)}\left[\begin{array}{c}V_T W_S + L_S W_S \alpha\sin\theta + \alpha\cos\theta \\ \left(\frac{(d_1+2W_S)^2 - (d_1+W_S)^2}{2}\right)\end{array}\right][dL]}{W_s \times L_s}$$

$$V_{T11} = \frac{\int_{(L_S+d_2)}^{(2L_S+d_2)}\left[\begin{array}{c}V_T W_S + L_S W_S \alpha\sin\theta + \\ \alpha\cos\theta\left(\dfrac{d_1^2 + 4W_S^2 + 4d_1 W_S -}{d_1^2 - W_S^2 - 2d_1 W_S}\right)\\ \phantom{\alpha\cos\theta}\dfrac{}{2}\end{array}\right][dL]}{W_s \times L_s}$$

$$V_{T11} = \frac{\int_{(L_S+d_2)}^{(2L_S+d_2)}\left[\begin{array}{c}V_T W_S + L_S W_S \alpha\sin\theta + \alpha\cos\theta \\ \left(\dfrac{3W_S^2 + 2W_S d_1}{2}\right)\end{array}\right][dL]}{W_S \times L_S}$$

$$V_{T11} = \frac{\int_{(L_S+d_2)}^{(2L_S+d_2)}\left[\begin{array}{c}V_T + L_S\alpha\sin\theta + \\ \alpha\cos\theta\left(\dfrac{3W_S}{2} + d_1\right)\end{array}\right][dL]}{L_S}$$

$$V_{T11} = \frac{\left[V_T L_S + \alpha\cos\theta\left(\dfrac{3W_S}{2} + d_1\right)L_S + \alpha\sin\theta\left(\dfrac{(2L_S+d_2)^2 - (L_S+d_2)^2}{2}\right)\right]}{L_S}$$

$$V_{T11} = \frac{\left[\begin{array}{c}V_T L_S + \alpha\cos\theta\left(\dfrac{3W_S}{2} + d_1\right)L_S + \\ \alpha\sin\theta\left(\dfrac{4L_S^2 + d_2^2 + 4L_S d_2 - L_S^2 - d_2^2 - 2L_S d_2}{2}\right)\end{array}\right]}{L_S}$$

$$V_{T11} = \frac{\left[V_T L_S + \alpha\cos\theta\left(\dfrac{3W_S}{2} + d_1\right)L_S + \alpha\sin\theta\left(\dfrac{3L_S^2 + 2L_S d_2}{2}\right)\right]}{L_S}$$

$$V_{T11} = V_T + \alpha\left(\frac{3W_S}{2} + d_1\right)\cos\theta + \alpha\left(\frac{3L_S}{2} + d_2\right)\sin\theta$$

Similarly, the threshold voltage $V_{T12}$ of the sub-transistor MS12 is given by the following equation.

$$MS12:\ V_{T12} = V_T + \frac{W_S}{2}\alpha\cos\theta + \frac{L_S}{2}\alpha\sin\theta$$

Similarly, the threshold voltage $V_{T21}$ of the sub-transistor MS21 is given by the following equation.

$$MS21: V_{T21} = V_T + \alpha\left(\frac{3W_S}{2} + d_1\right)\cos\theta + \frac{L_S}{2}\alpha\sin\theta$$

Similarly, the threshold voltage $V_{T22}$ of the sub-transistor MS22 is given by the following equation.

$$MS22: V_{T22} = V_T + \frac{W_S}{2}\alpha\cos\theta + \alpha\left(\frac{3L_S}{2} + d_2\right)\sin\theta$$

In the equations described above, d1 denotes a distance between drains (sources) of neighboring sub-transistors, d2 denotes a distance between gates of neighboring sub-transistors, Ws denotes a width of the gate of the sub-transistor and Ls denotes a length of the gate of the sub-transistor.

Figure 10:
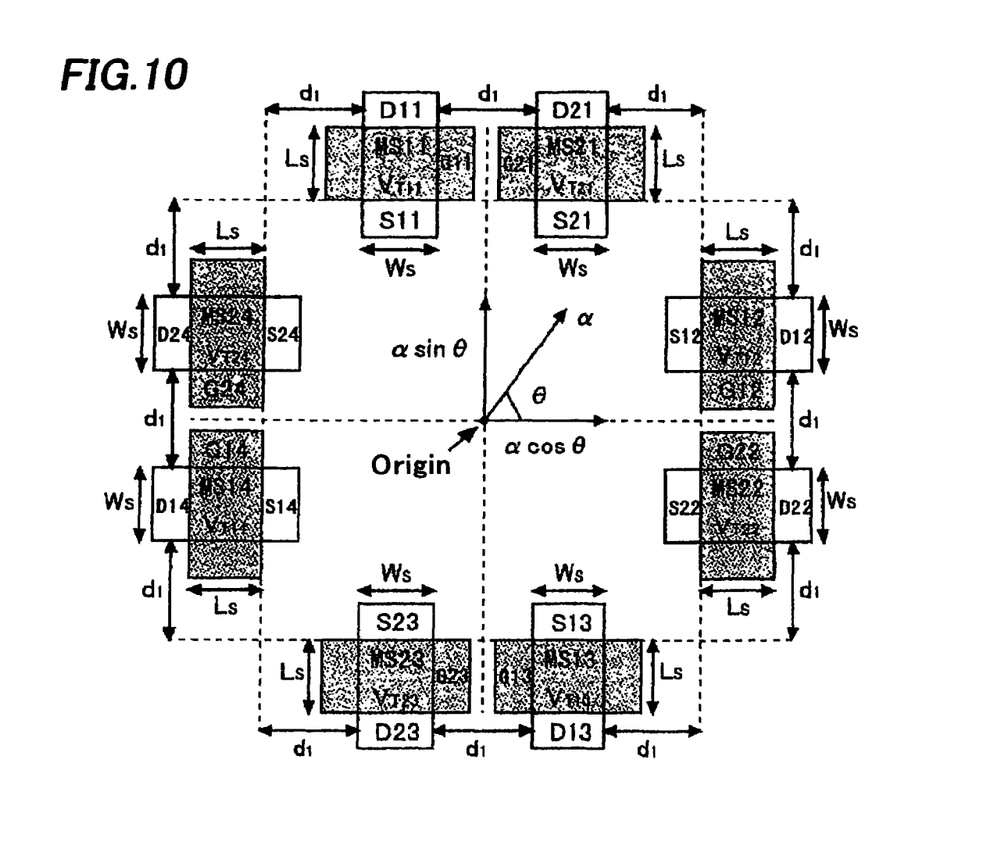
FIG. 10 a plan view showing a four-segment layout scheme.
Figure 11:
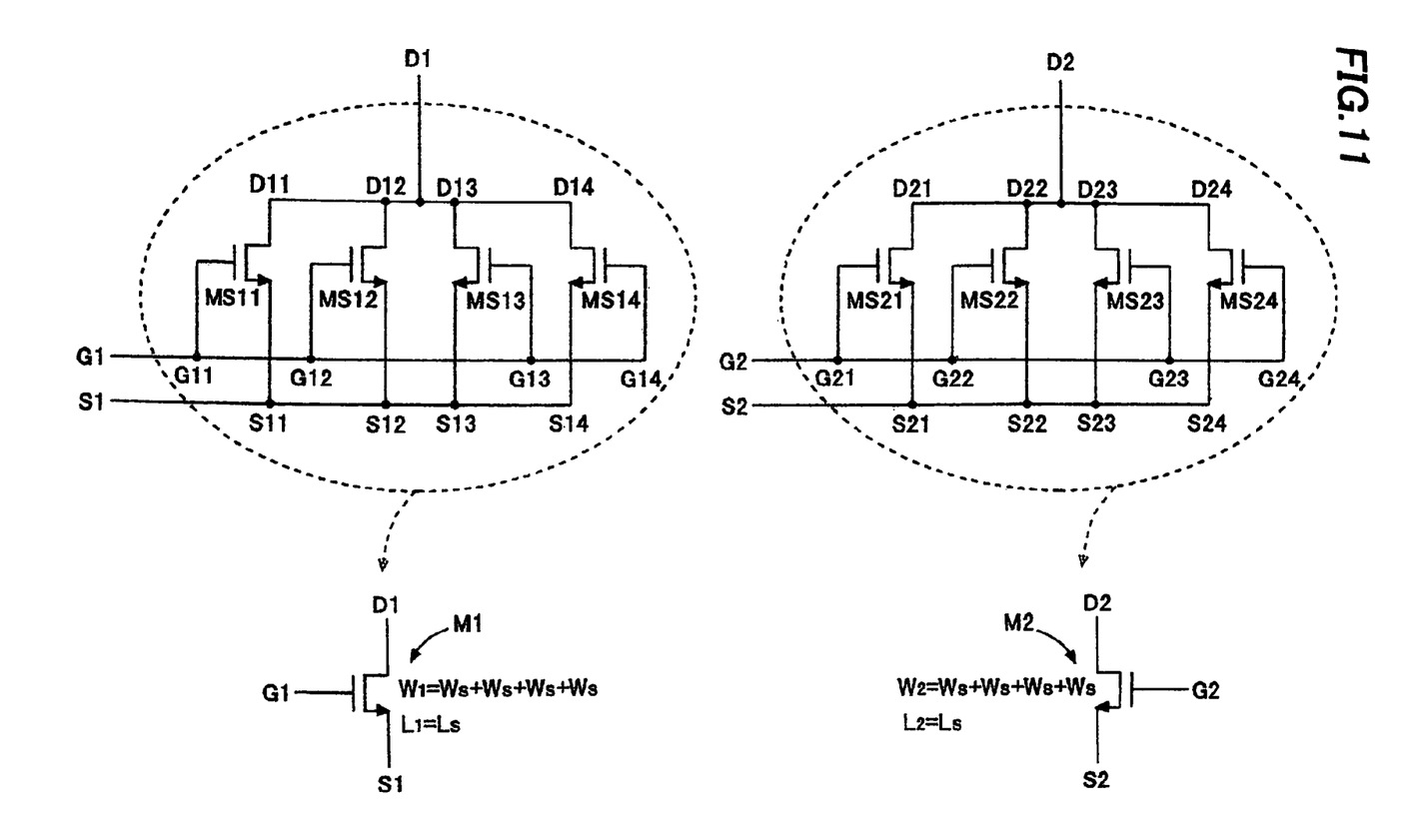
FIG. 11 is an equivalent circuit diagram of the four-segment layout scheme.

Next, FIG. 10 shows the four-segment layout scheme. FIG. 11 shows an equivalent circuit of FIG. 10. M1 and M2 are MOS field effect transistors that are to be matched. The transistor M1 is divided into four sub-transistors MS11, MS12, MS13 and MS14. These sub-transistors are disposed in four segments.

Similarly, the transistor M2 is divided into four sub-transistors MS21, MS22, MS23 and MS24. These sub-transistors are disposed in four segments.

An origin O, a gradient amplitude a and a gradient direction θ are also defined with respect to the four-segment layout scheme as shown in FIG. 10, and equations below that describe results of the modeling of the threshold values are obtained. That is, it is assumed in the following equations that a threshold value of the sub-transistor MS11 is $V_{T11}$, a threshold value of the sub-transistor MS12 is $V_{T12}$, a threshold value of the sub-transistor MS13 is $V_{T13}$, a threshold value of the sub-transistor MS14 is $V_{T14}$, a threshold value of the sub-transistor MS21 is $V_{T21}$, a threshold value of the sub-transistor MS22 is $V_{T22}$, a threshold value of the sub-transistor MS23 is $V_{T23}$ and a threshold value of the sub-transistor MS24 is $V_{T24}$.

$$MS11: V_{T11} = V_T - \alpha\left(\frac{W}{2} + \frac{d_1}{2}\right)\cos\theta + \alpha\left(\frac{L}{2} + W + \frac{3d_1}{2}\right)\sin\theta$$

$$MS12: V_{T12} = V_T + \alpha\left(W + \frac{L}{2} + \frac{3d_1}{2}\right)\cos\theta + \alpha\left(\frac{W}{2} + \frac{d_1}{2}\right)\sin\theta$$

$$MS13: V_{T13} = V_T + \alpha\left(\frac{W}{2} + \frac{d_1}{2}\right)\cos\theta - \alpha\left(\frac{L}{2} + W + \frac{3d_1}{2}\right)\sin\theta$$

$$MS14: V_{T14} = V_T - \alpha\left(W + \frac{L}{2} + \frac{3d_1}{2}\right)\cos\theta - \alpha\left(\frac{W}{2} + \frac{d_1}{2}\right)\sin\theta$$

$$MS21: V_{T21} = V_T + \alpha\left(\frac{W}{2} + \frac{d_1}{2}\right)\cos\theta + \alpha\left(\frac{L}{2} + W + \frac{3d_1}{2}\right)\sin\theta$$

$$MS22: V_{T22} = V_T + \alpha\left(W + \frac{L}{2} + \frac{3d_1}{2}\right)\cos\theta - \alpha\left(\frac{W}{2} + \frac{d_1}{2}\right)\sin\theta$$

$$MS23: V_{T23} = V_T - \alpha\left(\frac{W}{2} + \frac{d_1}{2}\right)\cos\theta - \alpha\left(\frac{L}{2} + W + \frac{3d_1}{2}\right)\sin\theta$$

$$MS24: V_{T24} = V_T - \alpha\left(W + \frac{L}{2} + \frac{3d_1}{2}\right)\cos\theta + \alpha\left(\frac{W}{2} + \frac{d_1}{2}\right)\sin\theta$$

In the equations described above, d1 denotes a distance between drains (sources) of neighboring sub-transistors, Ws denotes a width of a gate of the sub-transistor and Ls denotes a length of the gate of the sub-transistor.

SUMMARY OF THE INVENTION

The four-segment layout scheme described above can achieve better matching performance compared with the centroid layout scheme. However, the four-segment layout scheme has a drawback of requiring a large pattern area.

Figure 1:
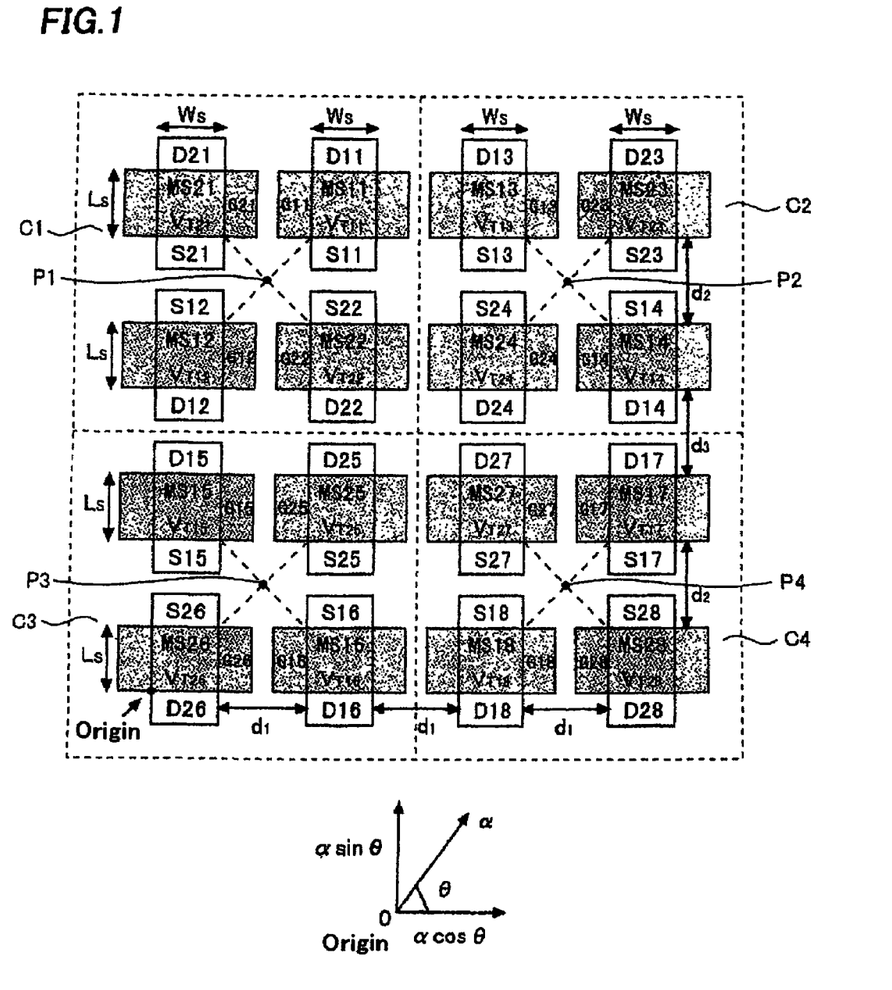
FIG. 1 is a plan view showing a multiple-common-centroid layout configuration according to an embodiment of this invention.

Thus, a circuit layout configuration of this invention is a layout configuration in which a pair of transistors required close matching is divided into sub-transistors arrayed in a matrix with four rows and four columns forming four cells each composed of four sub-transistors, and the sub-transistors belonging to each cell have a common center, as shown in FIG. 1.

This can realize a layout configuration that is as good in matching of the pair of transistors as the four-segment layout scheme and takes small pattern area.

DETAILED DESCRIPTION OF THE INVENTION

Figure 2:
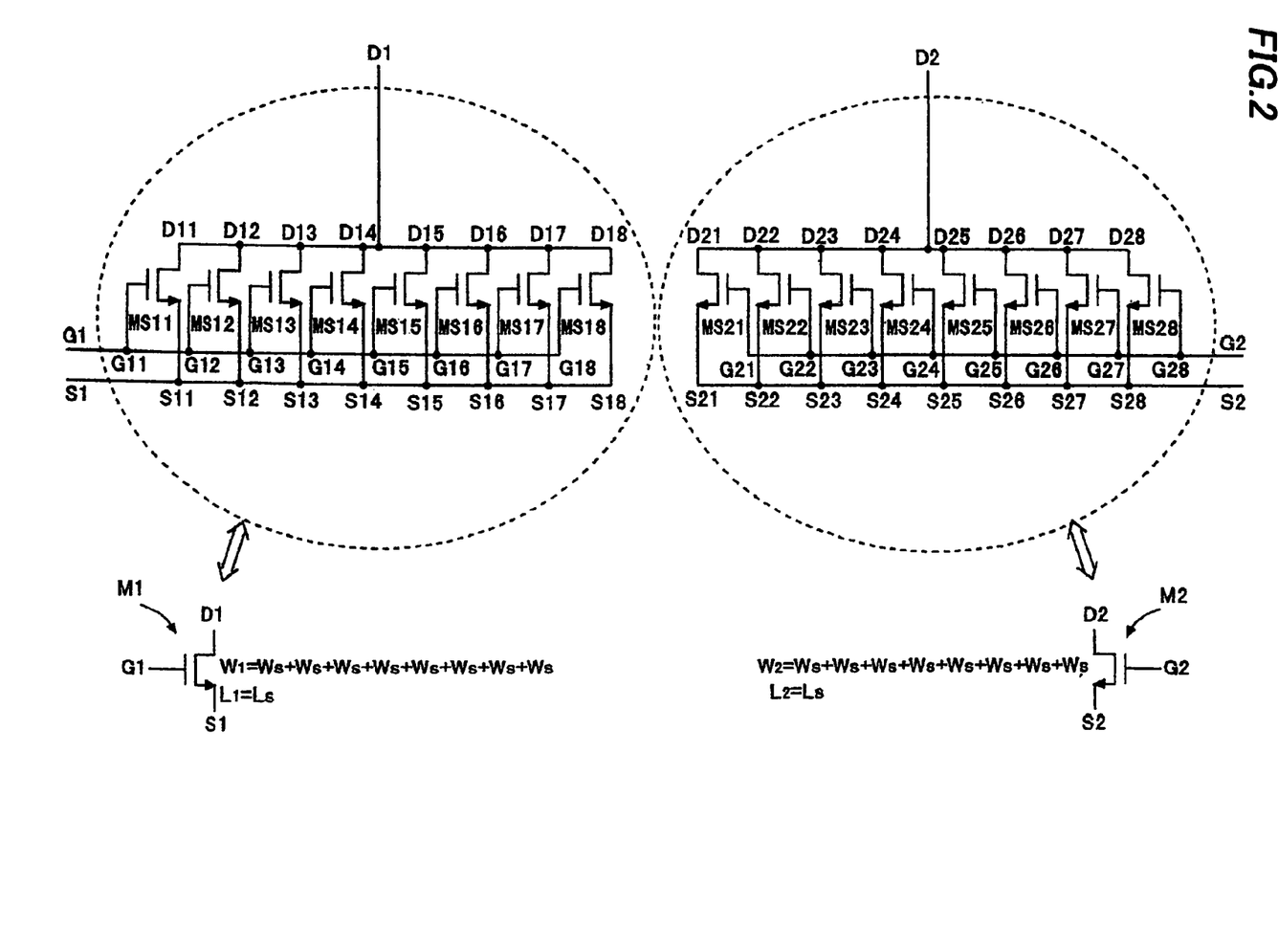
FIG. 2 is an equivalent circuit diagram of the multiple-common-centroid layout configuration according to the embodiment of this invention.

Next, an embodiment of this invention will be explained in detail, referring to figures. FIG. 1 shows a multiple-common-centroid layout configuration. FIG. 2 shows an equivalent circuit diagram of FIG. 1. M1 and M2 are MOS field effect transistors that are to be matched. The first transistor M1, that is a main-transistor, is divided into eight sub-transistors MS11, MS12, MS13, MS14, MS15, MS16, MS17 and MS18. Gates, drains and sources of these sub-transistors are connected in common to form the first transistor M1.

And similarly, the second transistor M2, that is a main-transistor, is also divided into eight sub-transistors MS21, MS22, MS23, MS24, MS25, MS26, MS27 and MS28. And gates, drains and sources of these sub-transistors are connected in common to form the second transistor M2.

The first transistor M1 and the second transistor M2 can form differential input pair transistors of a differential amplifier. And when a current mirror is formed with the first transistor M1 and the second transistor M2, the gates of the sub-transistors are connected in common with each other.

Above-mentioned 16 sub-transistors forming the first and second transistors M1 and M2 are arrayed in a matrix with four rows and four columns, when viewed as a whole. The matrix is formed of four cells. A first cell C1 is composed of the sub-transistors MS11 and MS12 and the sub-transistors MS21 and MS22:

A second cell C2 is composed of the sub-transistors MS13 and MS14 and the sub-transistors MS23 and MS24. A third cell C3 is composed of the sub-transistors MS15 and MS16 and the sub-transistors MS25 and MS26. A fourth cell C4 is composed of the sub-transistors MS17 and MS18 and the sub-transistors MS27 and MS28.

To explain the first cell C1 in detail, the sub-transistor MS21 disposed at a first row and a first column, the sub-transistor MS22 disposed at a second row and a second column, the sub-transistor MS11 disposed at the first row and the second column and the sub-transistor MS12 disposed at the second row and the first column have a common center P1.

The sources and drains of these sub-transistors are arrayed parallel to a column direction while their gates are arrayed parallel to a row direction. And the second cell C2, the third cell C3 and the fourth cell C4 are formed with symmetrical configuration based on the first cell C1. Each of the second cell C2, the third cell C3 and the fourth cell C4 has each of common centers P2, P3 and P4, respectively.

Figure 3:
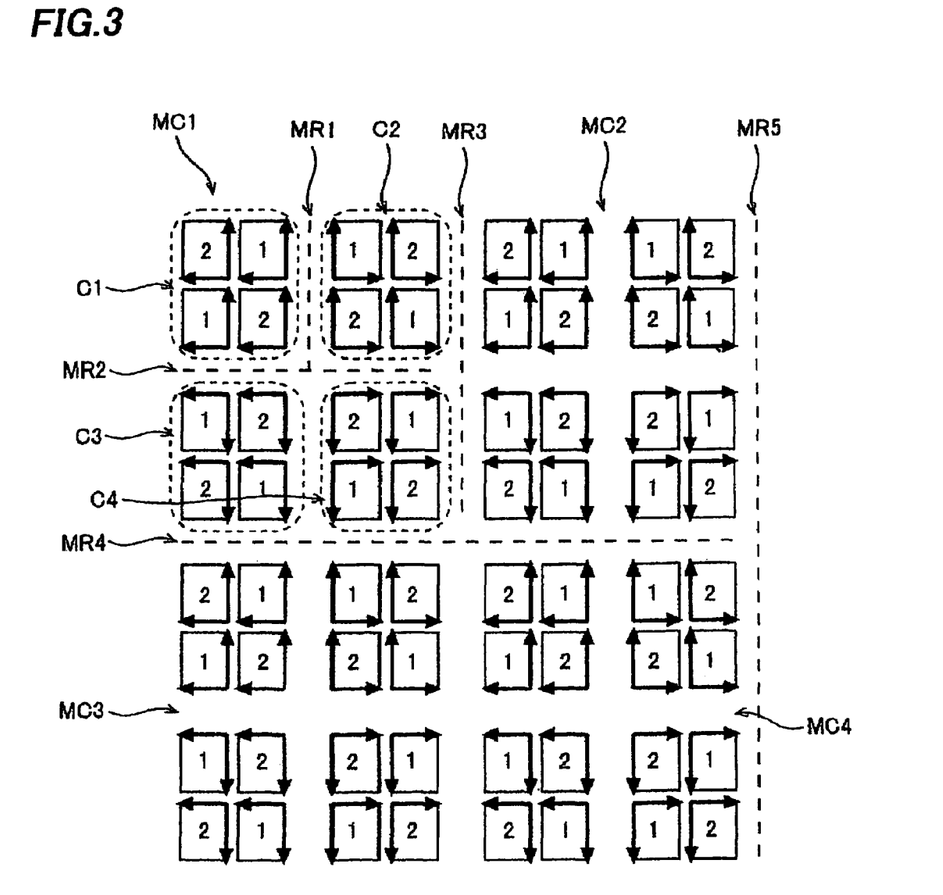
FIG. 3 is a schematic diagram of the multiple-common-centroid layout configuration according to the embodiment of this invention.

FIG. 3 is a layout to explain a concept of the symmetrical configuration clearly. In the figure, the sub-transistors forming the first transistor M1 are marked with "1", and the sub-transistors forming the second transistor M2 are marked with "2". As seen from the figure, the second cell C2 is obtained by disposing the first cell C1 axisymmetrically (mirror symmetrically) with respect to a line of symmetry MR1. Also, the third cell C3 is obtained by disposing the first cell C1 axisymmetrically with respect to a line of symmetry MR2. The fourth cell C4 is obtained by disposing the second cell C2 axisymmetrically with respect to the line of symmetry MR2.

With that, a circuit layout configuration of the first transistor M1 and the second transistor M2 is obtained. When it is defined as a macro cell MC1, a macro cell MC2 that is axisymmetrical with respect to a line of symmetry MR3 is obtained based on the macro cell MC1. And a macro cell MC3 and a macro cell MC4, that are axisymmetrical with respect to a line of symmetry MR4, can be further obtained based on the macro cells MC1 and MC2.

Furthermore, a macro cell that is not shown in the figure can be obtained by disposing the macro cells MC1, MC2, MC3 and MC4 with respect to a line of symmetry MR5. Macro cells can be increased indefinitely by repeating such symmetrical configuration.

Next, when the threshold voltage model described above is applied to the 16 sub-transistors mentioned above, a threshold value for each of the sub-transistors is given by each of the following equations. An origin O, a gradient amplitude a and a gradient direction θ are defined in FIG. 1.

$$MS11: V_{T11} = V_T + \alpha\left(\frac{3W_S}{2} + d_1\right)\cos\theta + \alpha\left(\frac{7L_S}{2} + 2d_2 + d_3\right)\sin\theta$$

$$MS12: V_{T12} = V_T + \frac{W_S}{2}\alpha\cos\theta + \alpha\left(\frac{5L_S}{2} + d_2 + d_3\right)\sin\theta$$

$$MS13: V_{T13} = V_T + \alpha\left(\frac{5W_S}{2} + 2d_1\right)\cos\theta + \alpha\left(\frac{7L_S}{2} + 2d_2 + d_3\right)\sin\theta$$

-continued $$MS14: V_{T14} = V_T + \alpha\left(\frac{7W_S}{2} + 3d_1\right)\cos\theta + \alpha\left(\frac{5L_S}{2} + d_2 + d_3\right)\sin\theta$$

$$MS15: V_{T15} = V_T + \frac{W_S}{2}\alpha\cos\theta + \alpha\left(\frac{3L_S}{2} + d_2\right)\sin\theta$$

$$MS16: V_{T16} = V_T + \alpha\left(\frac{3W_S}{2} + d_1\right)\cos\theta + \frac{L_S}{2}\alpha\sin\theta$$

$$MS17: V_{T17} = V_T + \alpha\left(\frac{7W_S}{2} + 3d_1\right)\cos\theta + \alpha\left(\frac{3L_S}{2} + d_2\right)\sin\theta$$

$$MS18: V_{T18} = V_T + \alpha\left(\frac{5W_S}{2} + 2d_1\right)\cos\theta + \frac{L_S}{2}\alpha\sin\theta$$

$$MS21: V_{T21} = V_T + \frac{W_S}{2}\alpha\cos\theta + \alpha\left(\frac{7L_S}{2} + 2d_2 + d_3\right)\sin\theta$$

$$MS22: V_{T22} = V_T + \alpha\left(\frac{3W_S}{2} + d_1\right)\cos\theta + \alpha\left(\frac{5L_S}{2} + d_2 + d_3\right)\sin\theta$$

$$MS23: V_{T23} = V_T + \alpha\left(\frac{7W_S}{2} + 3d_1\right)\cos\theta + \alpha\left(\frac{7L_S}{2} + 2d_2 + d_3\right)\sin\theta$$

$$MS24: V_{T24} = V_T + \alpha\left(\frac{5W_S}{2} + 2d_1\right)\cos\theta + \alpha\left(\frac{5L_S}{2} + d_2 + d_3\right)\sin\theta$$

$$MS25: V_{T25} = V_T + \alpha\left(\frac{3W_S}{2} + d_1\right)\cos\theta + \alpha\left(\frac{3L_S}{2} + d_2\right)\sin\theta$$

$$MS26: V_{T26} = V_T + \frac{W_S}{2}\alpha\cos\theta + \frac{L_S}{2}\alpha\sin\theta$$

$$MS27: V_{T27} = V_T + \alpha\left(\frac{5W_S}{2} + 2d_1\right)\cos\theta + \alpha\left(\frac{3L_S}{2} + d_2\right)\sin\theta$$

$$MS28: V_{T28} = V_T + \alpha\left(\frac{7W_S}{2} + 3d_1\right)\cos\theta + \frac{L_S}{2}\alpha\sin\theta$$

In the equations described above, d1 denotes a distance between drains (sources) of neighboring sub-transistors, d2 and d3 denote distances between gates of neighboring sub-transistors, Ws denotes a width of the gate of the sub-transistor and Ls denotes a length of the gate of the sub-transistor.

Figure 4:
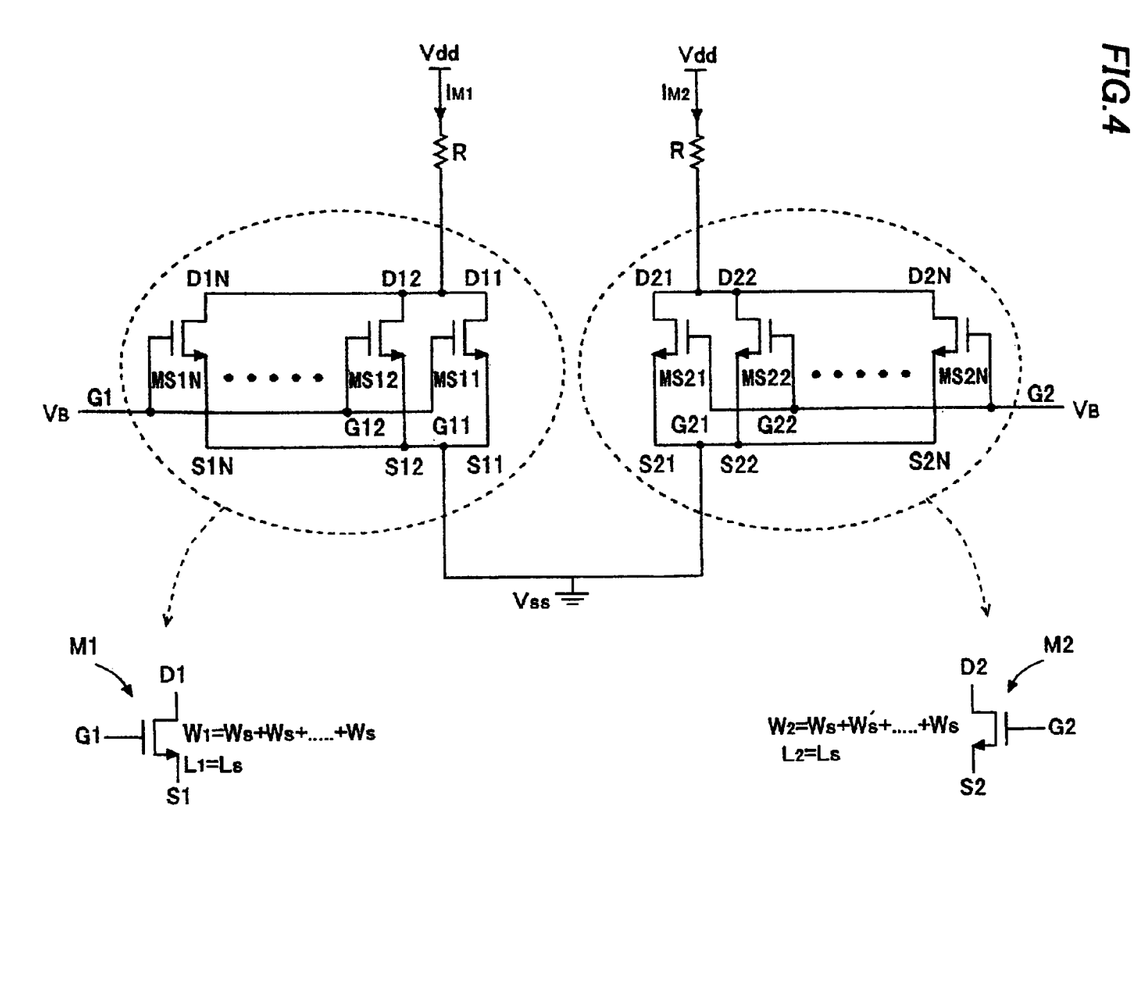
FIG. 4 is a circuit diagram of a circuit used for simulations of various kinds of layout.

Next, simulations using HSPICE are explained. An aim of the simulations is to check performance of various transistor-matching layouts with respect to change in the gradient direction θ. Parameters common to all the simulations are, d1=d2=d3 4 μm, α=0.5 mV/μm, $V_T$=0.7V FIG. 4 shows a circuit diagram of a circuit used for the simulations. A first transistor M1, that is a main-transistor, is divided into N sub-transistors MS11-MS1N, and a bias voltage $V_B$ is applied to their gates in common. And a high power supply Vdd is applied to a common drain D1 of the sub-transistors MS11-MS1N through a resistor R. And a low power supply Vss is applied to a common source S1 of the sub-transistors MS11-MS1N.

A second transistor M2, that is a main-transistor, is divided into N sub-transistors MS21-MS2N, and a bias voltage $V_B$ is applied to their gates in common. And the high power supply Vdd is applied to a common drain D2 of the sub-transistors MS21-MS2N through a resistor R. And the low power supply Vss is applied to a common source S2 of the sub-transistors MS21-MS2N.

Here, for all the simulations performed, a percent mismatch is defined by the following equation.

$$\text{Percent Mismatch} = \frac{I_{M2} - I_{M1}}{I_{M1}} \times 100$$

Here, $I_{M1}$ denotes a current flowing through the first transistor M1 and $I_{M2}$ denotes a current flowing through the second transistor M2. Two sets of simulations are performed to compare the performance of the different transistor-matching layouts. In a first set, sizes of the sub-transistors are set as Ws=10 µm and Ls=10 µm for all the layout schemes.

Thus, widths W and lengths L for various layout schemes are as follows.

| common-centroid layout: | W = 20 µm | L = 10 µm |
| four-segment layout: | W = 40 µm | L = 10 µm |
| multiple-common-centroid layout: | W = 80 µm | L = 10 µm |

Figure 5:
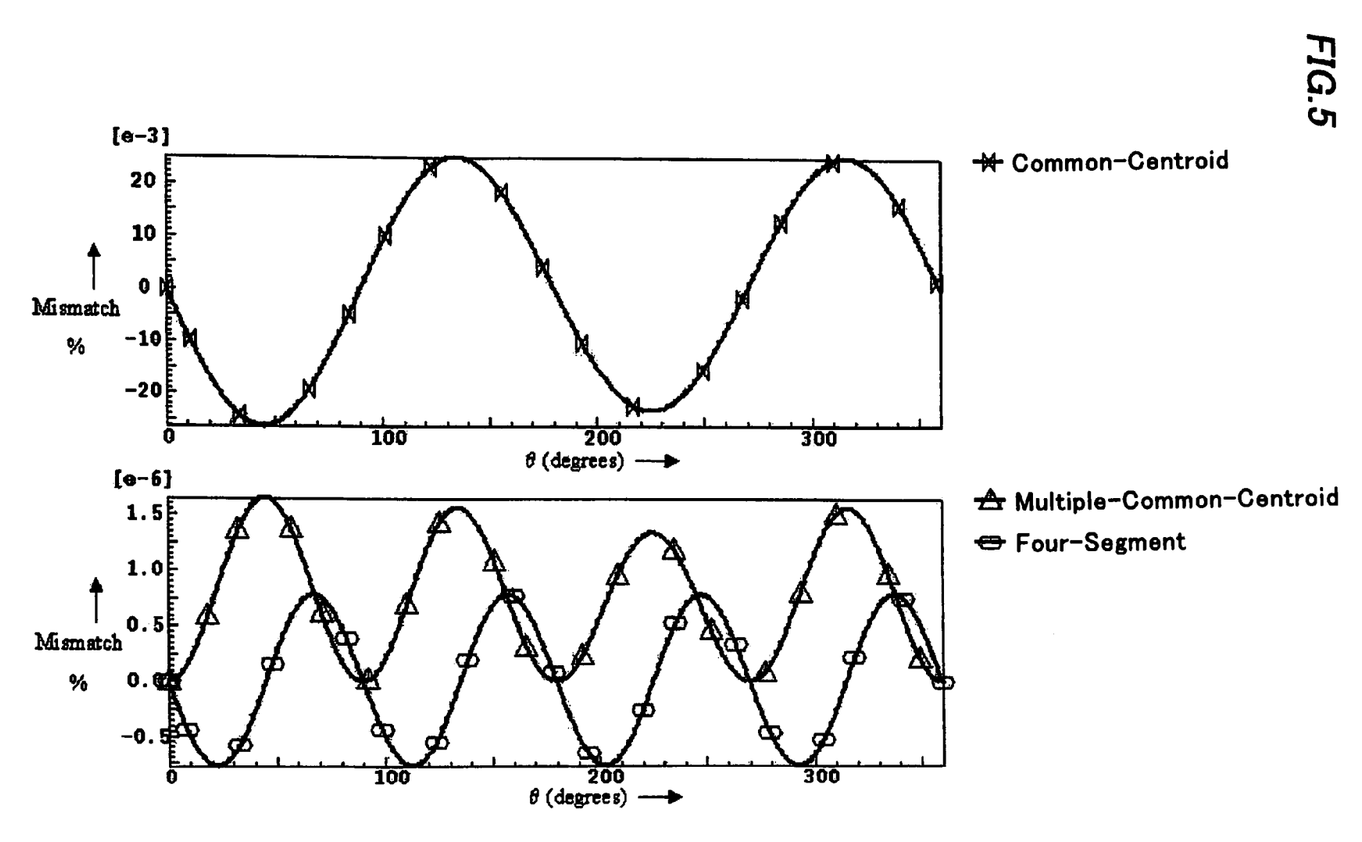
FIG. 5 shows results of simulations using HSPICE.

FIG. 5 shows simulation results for the first set of simulations. A horizontal axis shows the gradient direction θ, while a vertical axis shows the percent mismatch (%). As clearly seen from the results, the multiple-common-centroid layout of this invention shows an improvement in the matching performance comparable to the common-centroid layout. That is, the percent mismatch (%) for the multiple-common-centroid layout is three orders smaller than that for the common-centroid layout.

A second set of the simulation is performed under conditions that sizes of the first transistor M1 and the second transistor M2 are same for all the layout schemes. That is, the width W is 80 µm and the length W is 10 µm for the first transistor M1 and for the second transistor M2. Thus, dimensions of the sub-transistors for various layout schemes are as follows.

| common-centroid layout: | Ws = 40 µm | Ls = 10 µm |
| four-segment layout: | Ws = 20 µm | Ls = 10 µm |
| multiple-common-centroid layout: | Ws = 10 µm | Ls = 10 µm |

Figure 6:
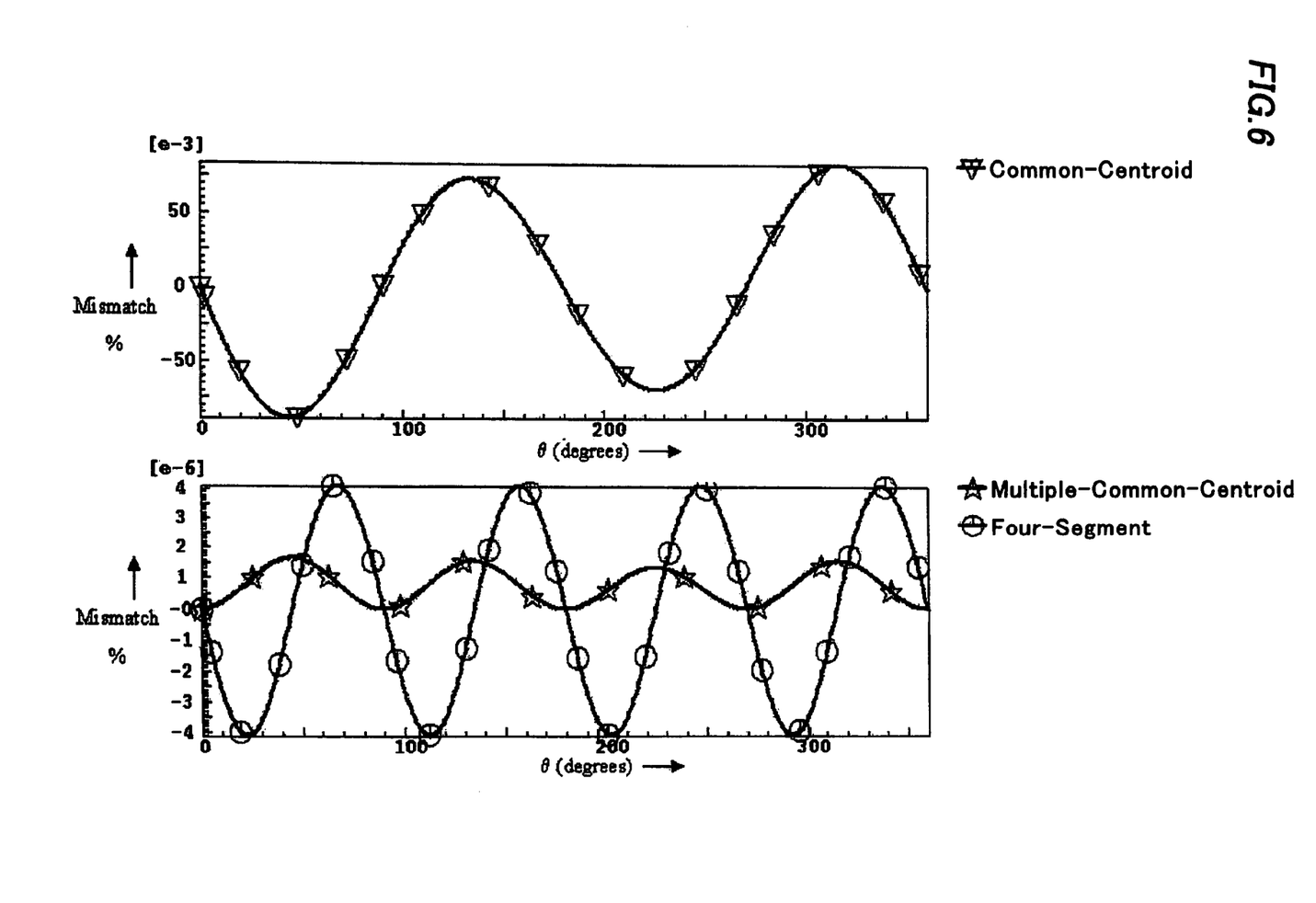
FIG. 6 shows results of simulations using HSPICE.

FIG. 6 shows simulation results for the second set of simulations. A horizontal axis shows the gradient direction θ, while a vertical axis shows the percent mismatch (%). The percent mismatch (%) for the multiple-common-centroid layout of this invention is improved compared with either of the other layouts, as the results clearly show.

Also, the multiple-common-centroid layout of this invention has a feature that it takes less layout area compared with the four-segment layout. Effect of the improvement in the matching by the multiple-common-centroid layout can be achieved at slightly more layout area requirement compared to the common-centroid layout.

The table below shows formulae to calculate areas for three different layout schemes and the calculated areas for a given set of parameters. Dimensions of the first transistor M1 and the second transistor M2, that are main-transistors, are the width W=80 µm and the length W=10 µm with d1=d2=d3=4 µm for all the layout schemes.

For the common-centroid layout, each of the main-transistors is divided into two sub-transistors. The width Ws is 40 µm and the length Ls is 10 µm for each of the sub-transistors. For the four-segment layout, each of the main-transistors is divided into four sub-transistors. The width Ws is 20 µm and the length Ls is 10 µm for each of the sub-transistors.

For the multiple-common-centroid layout of this invention, each of the main-transistors is divided into eight sub-transistors. The width Ws is 10 µm and the length Ls is 10 µm for each of the sub-transistors.

TABLE

| Layout Type | Area Estimation Formulae* | Calculated Area* [W = 80□m, L = 10□m d1 = d2 = d3 = 4□m] |
| --- | --- | --- |
| Common-Centroid | $(2L_s + d_2)(2W_s + d_1)$ | $2.016e - 9m^2$ [$W_s = 40\square$, $L_s = 10\square$] |
| Four-Segmented | $(2W_s + 2L_s + 3d_1)(2W_s + 2L_s + 3d_1)$ | $5.184e - 9m^2$ [$W_s = 20\square$, $L_s = 10\square$] |
| Multiple-Common-Centroid | $(4L_s + 2d_2 + d_3)(4W_s + 3d_1)$ | $2.704e - 9m^2$ [$W_s = 10\square$, $L_s = 10\square$] |

*$L_s$ and $W_s$ represent the dimensions of the sub-transistors.
*L and W represent the dimensions of the main-transistors.

As described above, the multiple-common-centroid layout of this invention has the effect that the matching performance comparable to the four-segment layout can be obtained while the layout area can be made small.

In particular, a low offset operational amplifier can be realized by applying the layout of this invention to a differential transistor pair and a transistor pair forming a current mirror of the operational amplifier.

The invention claimed is:

1. A circuit layout configuration for matching two transistors, comprising:
a first transistor comprising eight first sub-transistors; and
a second transistor comprising eight second sub-transistors,
wherein the eight first sub-transistors and the eight second sub-transistors are arranged in a four by four matrix, the eight second sub-transistors occupy eight diagonal positions of the four by four matrix, and the eight first sub-transistors occupy positions of the four by four matrix that are not the diagonal positions.

2. The circuit layout configuration of claim 1, wherein gates of the eight first sub-transistor and the eight second sub-transistors are connected so that the first transistor and the second transistor form a current mirror circuit.

3. The circuit layout configuration of claim 1, wherein gates of the first sub-transistors are connected to form a gate of the first transistor and gates of the second sub-transistors are connected to form a gate of the second transistor.

4. The circuit layout configuration of claim 3, wherein the first and second transistors form differential input pair transistors of an operational amplifier.

5. The circuit layout configuration of claim 1, wherein sources of the first sub-transistors are connected and drains of the first sub-transistors are connected.

6. The circuit layout configuration of claim 5, wherein sources of the second sub-transistors are connected and drains of the second sub-transistors are connected.

7. The circuit layout configuration of claim 1 wherein the first transistor comprises eight additional first sub-transistors, the second transistor comprises eight additional second sub-transistors, and the eight additional first sub-transistors and the eight additional second sub-transistors are arranged so as to be symmetrical with the eight first sub-transistors and the eight second sub-transistors with respect to a line of symmetry.

* * * * *